United States Patent
Peczalski et al.

(10) Patent No.: US 6,818,061 B2
(45) Date of Patent: Nov. 16, 2004

(54) METHOD FOR GROWING SINGLE CRYSTAL GAN ON SILICON

(75) Inventors: Andrzej Peczalski, Eden Prairie, MN (US); Thomas E. Nohava, Apple Valley, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/410,204

(22) Filed: Apr. 10, 2003

(65) Prior Publication Data

US 2004/0200406 A1 Oct. 14, 2004

(51) Int. Cl.[7] ............................................... C30B 25/22
(52) U.S. Cl. ........................... 117/104; 117/89; 117/90; 117/91; 117/94
(58) Field of Search ................................. 117/104, 952, 117/89, 90, 91, 94

(56) References Cited

U.S. PATENT DOCUMENTS

2002/0117677 A1 * 8/2002 Okuyama et al. .............. 257/94
2002/0145150 A1 * 10/2002 Okuyama et al. .............. 257/91
2003/0183835 A1 * 10/2003 Moku et al. .................... 257/99

OTHER PUBLICATIONS

X.F. Chen et al, "Enhancement in the quality of GaN Crystal Growth on a thermal–treated silicon substrate" Journal of Crystal Growth 240 (2002) 34–38

H. Zhang et al., "Investigation of preparation and properties of epitaxial growth GaN Film on Si (111) substrate", Journal of Crystal Growth 210 (2002) 511–515.

C.I. Park et al, "The Effect of Buffer Layers in MOCVD Growth of GaN Film on 3C–SiC/Si Substrate" Mat. Res. Soc. Symp. Proc. vol. 639 (2001) G3.25.1–G3.25.6.

F. Fedler et al, "Effect of High Temperature Single and Multiple AlN Intermediate Layers on N–polar and Ga–polar GaN Grown by Molecular Beam Epitaxy" Mat. Res. Soc. Symp. Proc. vol. 693 (2002) 177–182.

E. Preble et al, "Removal of 6H–SiC Substrate Influence when Evaluating GaN Thin Film Properties via X–ray", Met. Res. Soc. Symp. Proc. vol. 693 (2002) 233–238.

H. Zhang et al, "X–ray diffraction, photoluminescence and secondary ion mass spectroscopy study of GaN films grown on Si (111) substrate by vacuum reactive evaporation" Semicond. Sci Technol. 15 (2000) 649–652.

* cited by examiner

*Primary Examiner*—Robert Kunemund
(74) *Attorney, Agent, or Firm*—Shaw Pittman LLP

(57) ABSTRACT

A method for growing a single crystal GaN film at least 2 microns thick on a Si substrate is disclosed. The method includes growing a prelayer, a buffer layer including AlN on the Si substrate and a plurality of GaN layers and AlN layers deposited alternatively on the top of the AlN buffer layer. By controlling the deposition conditions and timings of the plurality of GaN layers and AlN layers, the single crystal GaN film can be grown thicker than 2 microns without cracks or pits.

39 Claims, 2 Drawing Sheets

METHOD FOR GROWING SINGLE CRYSTAL GAN ON SILICON

This invention was made with Government support under contract no. DAAB07-01-C-L500 awarded by the Department of the Army. The Government has certain rights in the invention.

BACKGROUND

Field of the Invention

The present invention generally relates to methods for growing single crystal GaN (Gallium Nitride) on a semiconductor substrate and, more particularly, to methods for growing single crystal GaN on a silicon wafer.

Background of the Invention

GaN and its alloys are promising as a wide band-gap, high temperature semiconductor material suitable for optoelectronic applications such as blue- and ultraviolet-light-emitted devices, and high power/high frequency devices, such as piezoelectric resonators, RF transistors and lasers. Currently, single crystal GaN film can be grown on a sapphire ($\alpha$-$Al_2O_3$) substrate with a (0 0 0 1) orientation. However, the large lattice and thermal mismatch between GaN film and sapphire leads to high defect density in the grown GaN film that deteriorates the optoelectronic properties of the GaN film. In addition, sapphire is not conductive and is difficult to integrate with other semiconductor devices. Accordingly, after formation of GaN film, the GaN film needs to be removed from the sapphire substrate for further processing.

A recent development is to grow GaN layers on a SiC (silicon carbide) substrate. SiC possesses a wide-band-gap with high thermal stability, excellent resistance to chemical attack, high thermal conductivity, high electron mobility, and relatively small lattice mismatch with GaN. However, SiC is very expensive and is typically available only in smaller diameter wafers. Although SiC is conductive and is relatively "matchable" with GaN, it is difficult to obtain a high quality, large size GaN film on a SiC substrate at a low cost. Moreover, recent GaN on SiC fabrication. techniques are not able to grow a 1 micron or greater unmasked GaN film without cracking. It is possible, however, to grow GaN on selected substrate areas with special patterns ("islands"), to achieve a thickness of up to 2 microns of GaN. Unfortunately, cracks and pits still often develop on the grown GaN when the grown, GaN on SiC is cooled down to room temperature. Furthermore, this technique requires several masking or etching steps, which is complicated and time consuming.

Compared with the sapphire and SiC substrates mentioned above, a silicon (Si) substrate is the most inexpensive and most promising for growth of GaN layer. A Si substrate not only has the advantages of low cost and good electrical and thermal conductivity, but also is available in larger wafer size. Further, GaN epitaxy on Si facilitates integration of microelectronics and optoelectronics. However, it is difficult to grow single crystal GaN directly on a Si substrate because of large mismatches between GaN and Si. Besides the large lattice mismatches between GaN and Si, there is a more significant problem of a larger thermal expansion coefficient of GaN than that of Si that limits successful heteroepitaxy. Therefore, the crystal quality of GaN-on-Si is still inferior to that of GaN layers grown on sapphire or SiC substrates.

Several techniques have been developed to solve the above problems in growing GaN on Si. For example, it has been suggested that a GaN epitaxy be grown on Si(1 1 1) by a vacuum reactive evaporation method or a MetalOrganic Chemical Vapor Deposition (MOCVD) using buffer layers of SiC and AlN, respectively. It has also been suggested that a cubic GaN layer be grown on a Si(0 0 1) substrate by plasma-assisted molecular beam epitaxy (MBE), or wurtzite GaN be grown on a $Si_3N_4$ buffer layer formed on a Si(1 1 1) substrate. However, none of these suggested techniques can grow a GaN film with a thickness of over 2 microns without cracks or pits over an entire surface of the Si substrate.

SUMMARY OF THE INVENTION

Accordingly, one object of the present invention is lo provide a method for growing a single crystal GaN film on a Si(1 1 1) substrate. The single crystal GaN is grown by a MOCVD method and includes a sequence of AlN and GaN layers alternatively deposited on the Si substrate. The deposition conditions and timings of these layers are controlled so that the single crystal GaN film can be formed thicker than 2 microns on the Si(1 1 1) substrate without cracks or pits.

In accordance with one embodiment of the invention, a method for growing a single crystal GaN (gallium nitride) film on a Si substrate comprises depositing a buffer layer on a top of the Si substrate using Trimethylaluminum (TMAl) in a hydrogen atmosphere, and depositing alternately a number of GaN layers and interlayers on top of the buffer layer.

In accordance with another embodiment of the present invention, each of the interlayers includes at least three layers: an AlN layer, a GaN layer and an AlN layer, from bottom to top. The AlN layer and the GaN layer in each interlayer are formed using TMAl and NH3 in a hydrogen atmosphere and TMGa and NH3 in a hydrogen atmosphere, respectively. Each of the AlN layer and the GaN layers within each interlayer has a thickness of about 100 Å.

In accordance with yet another embodiment of the present invention, the buffer layer, the GaN layers and the interlayers are formed by MOCVD at a pressure of about 100 Torr. The thickness of the buffer layer is about 400 Å and the thickness of each GaN layer is about 5000 Å.

In accordance with still another embodiment of the present invention, a single crystal GaN film structure comprises a Si(1 1 1) substrate, a buffer layer deposited on the Si(1 1 1) substrate that is formed by a metalorganic chemical vapor deposition (MOCVD) by using a trimethylaluminum (TMAl) as a reactive gases, and a plurality of GaN layers and interlayers alternatively deposited on the buffer layer with a GaN layer directly deposited on a top of the buffer layer and each of the interlayers interspaced between two GaN layers.

In accordance with still another embodiment of the invention, a Si substrate is prepared by first bathing a Si wafer in BOE (buffered oxide etch) etchant (10:1) for up to 1 minute. The wafer is then rinsed with deionized (DI) water for up to 10 minutes. The wafer is then removed from the DI water and any residual water is removed with a nitrogen gas steam. Afterward, the Si wafer is loaded into a MOCVD reactor. A prelayer is formed on the Si wafer after the baking step. The prelayer is deposited at a pressure of about 100 Torr in a hydrogen atmosphere and at a temperature of about 1210 degrees C. for about 4–8 seconds.

The features and attendant advantages of the present invention will be more fully appreciated upon a reading of the following detailed description in conjunction with the accompanying drawings.

DETAILED DESCRIPTION OF THE PREFERRED EMBODIMENT

A method for growing single crystal GaN film on a Si(1 1 1) substrate in accordance with the present invention is now described. According to the present invention, by depositing a sequence of GaN layers and AlN layers and by controlling the deposition conditions and timings, single crystal GaN film can be grown on the Si substrate up to a thickness of 2 microns without cracking or pits. The single crystal GaN film includes a plurality of GaN and AlN layers deposited alternately on the Si substrate after an AlN buffer layer is formed on the Si substrate. The pits of the single crystal GaN are eliminated by a specific combination depositing prelayer with advanced flow of TMAl (metalorganic Trimethylanluminum) and deposition temperature of the AlN buffer layer. Cracking is prevented by growing several sets of AlN/GaN superlattice interspaced between GaN layers. The depositions of the AlN buffer layer, GaN layers and AlN/GaN interlayers of the present invention are preferably carried out by MOCVD and by a blanket deposition method. Unlike prior art methods, masks with special-designed patterns are not necessary to achieve a GaN layer without cracking or pitting.

Figure 1:
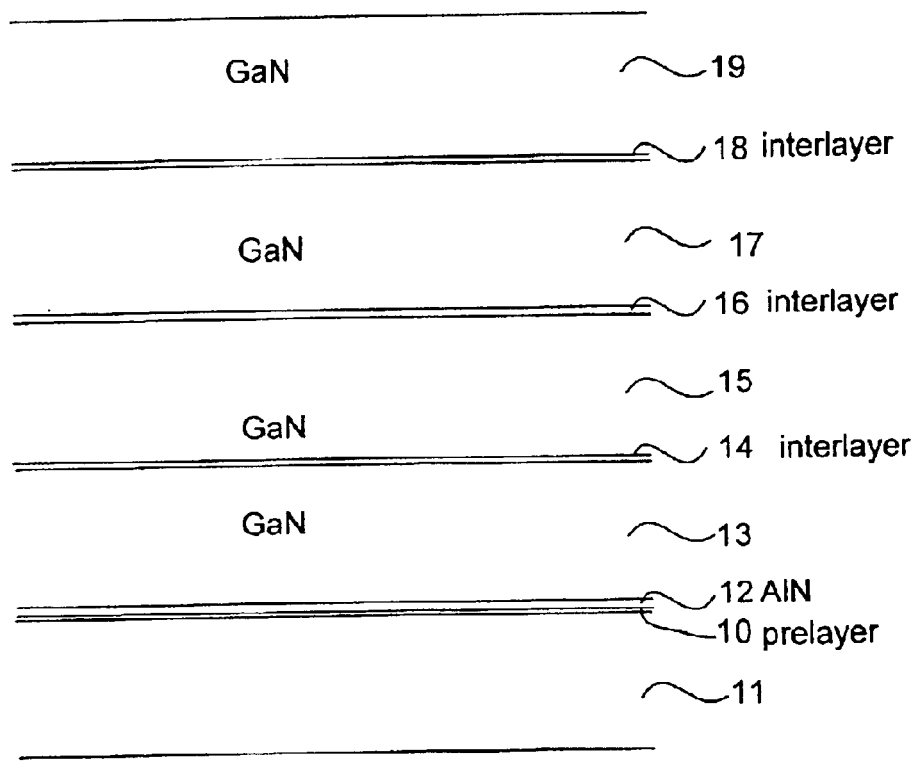
FIG. 1 is a schematic diagram showing the growth of single crystal GaN film on a Si substrate in accordance with the present invention.

FIG. 1 is a cross-sectional diagram showing a single crystal GaN film which includes a plurality of GaN layers and AlN layers alternatively grown on a Si substrate 11 in accordance with the method of the present invention.

Prior to the growth of GaN layers on Si substrate 11, Si substrate 11 can be prepared by bathing a Si wafer in a BOE (buffered oxide etch) etchant (10:1). The wafer is then rinsed with deionized (DI) water to clean up the BOE etchant residues of the Si wafer. After removal from the DI water, any residual water is removed with a nitrogen gas stream. In accordance with one embodiment of the present invention, the time of the Si wafer bathing in the BOE etchant may be up to 1 minute. The rinsing time may be up to 10 minutes. The Si wafer is then loaded into a MOCVD system growth reactor for a wafer bake procedure. The pressure used in the MOCVD reactor is preferably about 100 Torr and the bake gas is preferbly hydrogen. The wafer bake process is performed at a temperature of about 1150 degrees C. for about 10 minutes. Next, a prelayer is formed in a hydrogen atmosphere at a pressure of about 100 Torr and a temperature of about 1150 degrees C. for about 4–8 seconds. The prelayer is deposited on the wafer surface using the metalorganic Trimethylanluminum (TMAl), as shown as reference number 10 in FIG. 1.

Before growing a GaN layer, a buffer layer 12 including AlN (Aluminum Nitride) is preferably first deposited on the prelayer 10 and Si substrate 11. The purpose of buffer layer 12 is to compensate for the large lattice mismatch between Si substrate 11 and a GaN layer which will be deposited later. The better lattice match of AlN to GaN facilitates growth of a GaN layer in later processing. According to one preferred embodiment of the present invention, AlN buffer layer 12 may be grown using TMAl and Ammonia (NH3) as reactive gas at a pressure of about 100 Torr in a hydrogen atmosphere. Buffer layer 12 may be formed at a temperature of about 1150 degrees C. for a period of about 8 minutes. The thickness of the AlN buffer layer 12 is about 400 Angtroms (Å).

Following AlN buffer layer 12, a first GaN layer 13 is deposited on the top of AlN buffer layer 12. In accordance with a preferred embodiment of the present invention, several GaN layers such as first GaN layer 13, second GaN layer 15, third GaN layer 17 and fourth GaN layer 19 are deposited in a sequence with an interlayer such as first interlayer 14, second interlayer 16 and third interlayer 18 interspaced between adjacent GaN layers. In accordance with the preferred embodiment, the number of the GaN layers is four and the number of the interlayers is three.

GaN layers 13, 15, 17 and 19 are each deposited at a pressure of about 100 Torr in a hydrogen atmosphere using Trimethylgallium (TMGa) and NH3. Furthermore, GaN layers are deposited at a temperature of about 1050 degrees C. for a period of about 11 minutes and the thickness of each GaN layer is about 5000 Å. It is noted that fewer or more GaN layers can be used, depending on the required characteristics of the GaN single crystal film. In accordance with the present invention, the number of the interlayers may be N which is an integer no less than 1 and the number of GaN layers will then be N+1.

Figure 2:
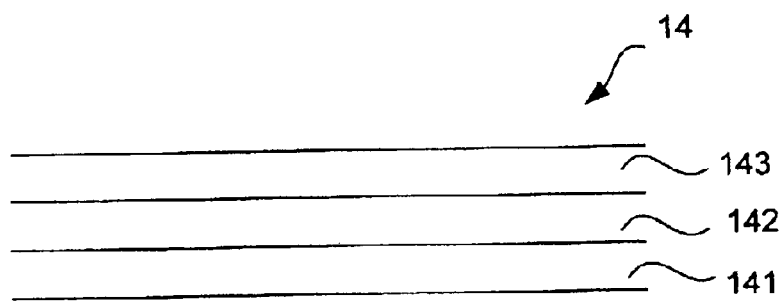
FIG. 2 is a schematic diagram showing a structure of an interlayer which is formed between two adjacent GaN layers and the Si substrate in FIG. 1.

FIG. 2 is a cross-sectional diagram showing an exemplary structure of interlayer 14. In accordance with one preferred embodiment of the present invention, each interlayer 14,16 and 18 includes three layers: AlN 141/GaN 142/AlN 143 from the bottom to the top. Each interlayer 14, 16 and 18 is deposited at a pressure of about 100 Torr in a hydrogen atmosphere. GaN layer 142 is deposited at a temperature of about 1050 degrees C. using TMGa and NH3 as reactive gases for a period of about 15 seconds. AlN layers 141 and 143 are deposited at a temperature of about 700 degrees C. using TMAl and NH3 as reactive gases for a period of about 2 minutes. The thicknesses of GaN layers 142 and AlN layers 141 and 143 are each about 100 Å.

Figure 3:
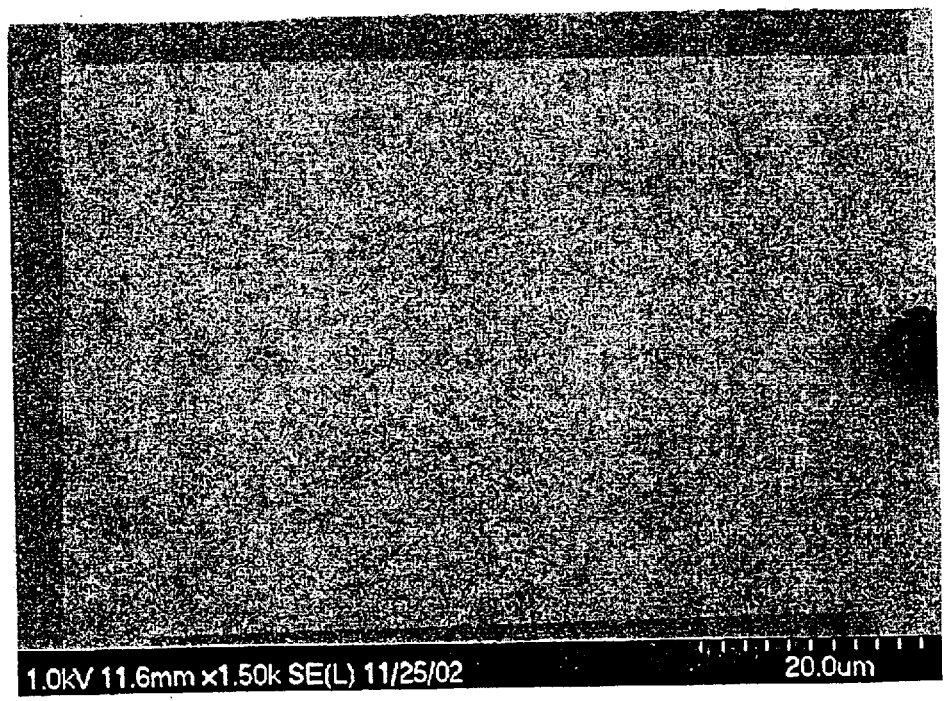
FIG. 3 is a photograph taken by a SEM optical microscope showing a single crystal GaN film including buffer layers and interlayers of a total thickness of 2 microns grown on a Si(1 1 1) substrate in accordance with the present invention.

FIG. 3 is a SEM optical microscope photograph of a GaN film on a Si substrate that was deposited according to the present invention. As shown, by growing several sets of GaN layers and AlN/GaN structures using MOCVD as described with reference to FIGS. 1 and 2, an equivalent single crystal GaN film with a thickness of at least 2 microns can be grown on a 4-inch-diameter Si substrate. The single crystal GaN film has a mirror-like surface which evidences that neither cracks nor pits appear in the GaN film. The dust speck shown at the right side of the photograph is necessary for focusing on the mirror surface and is not a defect of the GaN film.

It should be appreciated that although the number of layers in each interlayer 14, 16 and 18 shown in FIG. 2 is three, the number of layers in each interlayer can be altered. In general, the structure of each interlayer includes the following layer order: AlN/GaN/AlN/GaN/AlN and so on.

Furthermore, the particular temperatures used in forming the prelayer, AlN buffer layer, GaN layers and interlayers as disclosed herein should be considered exemplary only. It should be appreciated that other temperatures and pressures in conjunction with other deposition apparatuses may yield a structure consistent with that of the present invention.

Furthermore, the present invention utilizes a blanket (continuous film) deposition method to deposit several sets of AlN/GaN superlattice structure without using masks for depositing GaN layers in separate substrate areas. Therefore, the manufacture of the single crystal GaN film is simplified.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for growing a single crystal GaN (gallium nitride) film on a Si substrate, comprising:
    depositing at least one initial layer on a top of the Si substrate using Trimethylaluminum (TMAl) in a hydrogen atmosphere; and
    depositing alternately a plurality of GaN layers and interlayers on a top of the initial layer with each of the interlayers interspaced between adjacent GaN layers,
    wherein the number of the interlayers is N and the number of the GaN layer is N+1, and N is an integer no less than 1, and
    wherein each of the interlayers comprises an odd number of sub-layers and a bottom sub-layer and a top sub-layer comprises AlN.

2. The method of claim 1, wherein the at least one initial layer comprises at least one of a prelayer and a buffer layer.

3. The method of claim 1, wherein each of the GaN layers is grown using Trimethylgallium (TMGa) and Ammonia (NH3) in a hydrogen atmosphere and has a thickness of about 5000 Å.

4. The method of claim 2, wherein the buffer layer is grown using Trimethylaluminum (TMAl) and NH3 in a hydrogen atmosphere and has a thickness of about 400 Å.

5. The method of claim 1, wherein each of the interlayers includes at least one AlN layer that is formed by using TMAl and NH3 in a hydrogen atmosphere.

6. The method of claim 1, wherein each of the interlayers includes at least three layers comprising an AlN layer, a GaN layer and an AlN layer from bottom to top, wherein the AlN layer and the GaN layer in each interlayer are formed using TMAl and NH3 in a hydrogen atmosphere and TMGa and NH3 in a hydrogen atmosphere, respectively.

7. The method of claim 6, wherein each of the AlN layer and the GaN layers within each interlayer has a thickness of about 100 Å.

8. The method of claim 1, wherein the GaN layers and the interlayers are deposited by a metalorganic chemical vapor deposition (MOCVD) process and the pressure used in the process is about 100 Torr.

9. The method of claim 2, wherein the at least one of the prelayer and the buffer layer is deposited by a metalorganic chemical vapor deposition (MOCVD) process and the pressure used in the process is about 100 Torr.

10. The method of claim 9, wherein the deposition of the buffer layer is performed at a temperature of about 1150 degrees C. for about 8 minutes.

11. The method of claim 8, wherein the deposition of the GaN layer is performed at a temperature of about 1050 degrees C. for about 11 minutes.

12. The method of claim 8, wherein the deposition of the interlayer layer is performed at a temperature of about 1050 degrees C. for about 15 seconds for the GaN layer and at a temperature of about 700 degrees C. for about 2 minutes for the AlN layer.

13. The method of claim 1, wherein the Si substrate is a Si(1,1,1) substrate.

14. The method of claim 1, further comprising a preparation process for the Si substrate, wherein the preparation process includes:
    bathing a Si wafer in a BOE (buffer oxide etch) etchant (10:1);
    baking the Si wafer in a MOCVD system growth reactor in a hydrogen atmosphere; and
    depositing a prelayer on the Si wafer using metalorganic TMAl in a hydrogen atmosphere.

15. The method of claim 14, wherein the pressure used in the MOCVD system growth reactor is about 100 Torr and the prelayer is deposited at a temperature of about 1150 degrees C. for about 4–8 seconds.

16. The method of claim 14, wherein the prelayer is formed using metalorganic TMAl in a hydrogen.

17. The method of claim 14, wherein after bathing in the BOE etchant, the Si wafer is rinsed in deionized water and then removed from the deionized water.

18. A method for growing a single crystal GaN (gallium nitride) film on a Si substrate, comprising:
    depositing a prelayer on a top of the Si substrate;
    depositing a buffer layer on a top of the prelayer using Trimethylaluminum (TMAl) in a hydrogen atmosphere; and
    depositing alternately a plurality of GaN layers and interlayers on a top of the buffer layer with each of the interlayers interspaced between adjacent GaN layers,
    wherein the number of the interlayers is N and the number of the GaN layer is N+1, and N is an integer no less than 1, and
    wherein each of the interlayers comprises an odd number of sub-layers and a bottom sub-layer and a top sub-layer comprises AlN.

19. The method of claim 18, wherein the buffer layer has a thickness of about 400 Å.

20. The method of claim 18, wherein each of the GaN layers has a thickness of about 5000 Å.

21. The method of claim 18, wherein each of the interlayers includes at least three layers an AlN layer, a GaN layer and an AlN layer, each of the AlN layers is formed using TMAl and NH3 in a hydrogen atmosphere, and the GaN layer is formed using TMGa and NH3 in a hydrogen atmosphere.

22. The method of claim 21, wherein each of the AlN layer, the GaN layer and the AlN layer has a thickness of about 100 Å.

23. The method of claim 18, wherein the prelayer, the buffer layer, the GaN layers and the interlayers are deposited by a MOCVD process and the pressure used in the MOCVD process is about 100 Torr.

24. The method of claim 18, wherein the depositions of the prelayer and the buffer layer are performed at a temperature of about 1150 degrees C. for about 8 minutes.

25. The method of claim 18, wherein the deposition of the GaN layer is performed at a temperature of about 1050 degrees C. for about 11 minutes.

26. The method of claim 21, wherein the deposition of the interlayer layer is performed at a temperature of about 1050 degrees C. for about 15 seconds for the GaN layer and at a temperature of about 700 degrees C. for about 2 minutes for the AlN layer.

27. The method of claim 18, further comprising a preparation process for the Si substrate, the preparation process comprising:

bathing a Si wafer in a BOE (buffer oxide etch) etchant (10:1);

baking the Si wafer in a MOCVD system growth reactor in a hydrogen atmosphere; and depositing the prelayer on the Si wafer using metalorganic TMAl in a hydrogen atmosphere.

28. The method of claim 27, wherein the pressure used in the MOCVD system growth reactor is about 100 Torr and the prelayer is deposited at a temperature of about 1150 degrees C. for about 4–8 seconds.

29. A single crystal GaN film structure, comprising:

a Si(1 1 1) substrate;

at least one initial layer deposited on the Si(1 1 1) substrate which is formed by metalorganic chemical vapor deposition (MOCVD) by using trimethylaluminum (TMAl) as a reactive gases; and a plurality of GaN layers and interlayers alternatively deposited on the initial layer with a GaN layer directly deposited on a top of the initial layer and each of the interlayers interspaced between adjacent GaN layers, wherein the number of the interlayers is N and the number of the GaN layer is N+1, and N is an integer no less than 1, and wherein each of the interlayers comprises an odd number of sub-layers and a bottom sub-layer and a top sub-layer comprises AlN.

30. The single crystal GaN film structure of claim 29, wherein the at least one initial layer comprises at least one of a prelayer and a buffer AlN layer.

31. The single crystal GaN film structure of claim 29, wherein the numbers of the plurality of the interlayers and the GaN layers are N and N+1, respectively, and N is an integer no less than 1.

32. The single crystal GaN film structure of claim 29, wherein each of the GaN layers has a thickness of about 5000 Å.

33. The single crystal GaN film structure of claim 29, wherein each of the interlayers includes at least one AlN layer, which is formed by using TMAl and NH3 in a hydrogen atmosphere.

34. The single crystal GaN film structure of claim 29, wherein each of the interlayers includes at least three layers comprising of an AlN layer, a GaN layer and an AlN layer from bottom to top, wherein the AlN layer and the GaN layer in each interlayer are formed using TMAl and NH3 in a hydrogen atmosphere and TMGa and NH3 in a hydrogen atmosphere, respectively.

35. The single crystal GaN film structure of claim 34, wherein each of the AlN layer and the GaN layers within each interlayer has a thickness of about 100 Å.

36. The single crystal GaN film structure of claim 29, wherein the buffer layer, the GaN layers and the interlayers are deposited by a metalorganic chemical vaper deposition (MOCVD) process and the pressure used in the process is about 100 Torr.

37. The single crystal GaN film structure of claim 29, wherein the deposition of the initial layer is performed at a temperature of about 1150 degrees C. for about 8 minutes.

38. The single crystal GaN film structure of claim 29, wherein the deposition of the GaN layer is performed at a temperature of about 1050 degrees C. for about 11 minutes.

39. The single crystal GaN film structure of claim 34, wherein the deposition of the interlayer layer is performed at a temperature about 1050 degrees C. for about 15 seconds for the GaN layer and at a temperature of about 700 degrees C. for about 2 minutes for the AlN layer.

* * * * *

UNITED STATES PATENT AND TRADEMARK OFFICE
CERTIFICATE OF CORRECTION

PATENT NO. : 6,818,061 B2 Page 1 of 1
DATED : November 16, 2004
INVENTOR(S) : Andrzej Peczalski et al.

It is certified that error appears in the above-identified patent and that said Letters Patent is hereby corrected as shown below:

Column 5,
Line 46, "AIN" should read -- AlN --

Column 6,
Line 54, "AIN" should read -- AlN --

Column 8,
Lines 3 and 41, "AIN" should read -- AlN --

Signed and Sealed this

Seventeenth Day of May, 2005

JON W. DUDAS
*Director of the United States Patent and Trademark Office*